United States Patent [19]

Datta et al.

[11] 4,263,386

[45] Apr. 21, 1981

[54] METHOD FOR THE MANUFACTURE OF MULTI-COLOR MICROLITHOGRAPHIC DISPLAYS

[75] Inventors: Pabitra Datta, Cranbury, N.J.; Nitin V. Desai, Indianapolis, Ind.

[73] Assignee: RCA Corporation, New York, N.Y.

[21] Appl. No.: 127,795

[22] Filed: Mar. 6, 1980

[51] Int. Cl.³ .............................................. B05D 3/06
[52] U.S. Cl. ................................... 430/25; 427/43.1; 427/68; 427/54.1; 430/26; 430/28
[58] Field of Search ..................... 430/25, 26, 28, 253; 427/43.1, 54.1, 56.1, 68

[56] References Cited

U.S. PATENT DOCUMENTS

| | | |
|---|---|---|
| 2,854,348 | 9/1958 | Bowerman . |
| 3,260,612 | 7/1966 | Dulmage et al. ..................... 430/253 |
| 3,446,184 | 5/1969 | Johnson . |
| 3,544,350 | 12/1970 | Veirs . |
| 3,597,258 | 8/1971 | Lange et al. ........................... 427/68 |
| 3,893,127 | 7/1975 | Kaplan ..................................... 346/1 |
| 3,981,729 | 9/1976 | Saulnier . |
| 4,157,407 | 6/1979 | Peiffer ................................. 427/54.1 |
| 4,207,102 | 6/1980 | Dessauer ............................. 427/54.1 |

Primary Examiner—John H. Newsome
Attorney, Agent, or Firm—Birgit E. Morris; Edward J. Sites

[57] ABSTRACT

A method for the manufacture of multi-colored microlithographic displays especially fluorescent screens for cathode ray tubes is provided in which a film of an olefin sulfone polymer is applied to the substrate of the display. The film is then exposed in predetermined areas with a sufficient amount of radiation to depolymerize and lower the melting point of the polymer in the exposed areas. The film is then heated to a temperature above the softening point of the exposed polymer but below the softening point of unexposed polymer and contacted with the pigment or phosphor which is desired to be applied which selectively adheres to the exposed areas. The exposure and dusting are repeated for each application of different color pigments, toners or phosphors.

8 Claims, 2 Drawing Figures

LINE PATTERN

APPLY LAYER OF POSITIVE OLEFIN SULFONE RESIST, EXPOSE WITH RADIATION, HEAT TO SOFTENING POINT OF EXPOSED POLYMER AND SUPPLY FIRST COLOR PHOSPHOR TO MOLTEN AREA.

EXPOSE SECOND AREA, HEAT TO SOFTENED STATE AND SUPPLY SECOND COLOR PHOSPHOR

EXPOSE THIRD AREA, HEAT TO MOLTEN STATE AND SUPPLY THIRD COLOR PHOSPHOR

EXPOSE LAYER BY OVER ALL EXPOSURE AND APPLY BLACK MATRIX MATERIAL.

DOT PATTERN

METHOD FOR THE MANUFACTURE OF MULTI-COLOR MICROLITHOGRAPHIC DISPLAYS

This invention relates to a method for the manufacture of multi-color microlithographic displays. More particularly, this invention is concerned with a microlithographic method of applying to the viewing screen of a cathode ray tube several different color phosphors in discrete patterns and with repeats of the patterns in close registration with each other.

BACKGROUND OF THE INVENTION

Microlithography has become a widely utilized method for accurately reproducing predetermined images on selected substrates. In this process as taught by the prior art a photoresist is applied to the surface of a suitable substrate such as glass, paper, plastic, metal foil or the like. The coated substrate is then selectively exposed to radiation to cause the exposed portions to become either more soluble or less soluble depending on the type of resist employed. The photoresist is then developed in known manner. If a negative resist is employed, that is, a resist which becomes more insoluble as a result of exposure to radiation, and a suitable pigment or other similar material such as a phosphor is blended with the photoresist as applied using the above-described process, sharp half-tone reproduction can be produced. This method is currently used in half tone photolithographic printing and in the manufacture of monochromatic television picture tubes.

When it is desired to microlithographically produce multi-color images or patterns on a substrate, substantial additional problems in the reproduction process are encountered. The prior art processes require multiple applications of photoresists, one for each color pigment or color phosphor which is to be applied. This results in substantially increased cost and also introduces technical problems in aligning or registering each of the required images with the other images. These problems are encountered in all the prior art processes where multi-coatings of colors and multiple exposure to radiation are required, such as in color photolithographic printing. However, for the purpose of describing the invention, particular attention will be directed to the manufacture of multi-color fluorescent screens for cathode ray tubes. It will be appreciated that the same general procedures are readily employed with other products.

The cathode ray tube, or as it is more commonly known, the picture tube of a color television receiver, includes a glass faceplate on which there is formed the viewing screen. The viewing screen consists of groups of symmetrically placed lines or dots on phosphor powders which, when excited, emit different colors. A one line pattern or one dot pattern on the screen includes individual separate lines or dots of different color-emitting phosphors. Each line pattern or dot pattern generally consists of three separate lines or separate dots, respectively, of red, green, and blue color-emitting phosphors which are the primary color phosphors used to produce colored images on the viewing screen of cathode ray tubes. A black material can also be used to provide a black matrix about the color phosphor areas. Typically, the number of separate areas which can be excited during a full scan of a cathode ray tube having a diagonal width of about 50 centimeters will be about 500,00 to 1,000,000 or even higher. As the number of separate discrete patterns of different colored phosphors which can be excited on the screen increase, the picture generally becomes brighter and the color reproduction of the image becomes more accurate.

When a cathode ray tube is fully assembled for use, for example in a color television receiver, a thin perforated metal plate called a shadow mask is placed a short distance from the screen. The shadow mask has a large number of critically spaced apertures which are in alignment with the phosphor areas on the screen. When the screen is scanned with an aimed electron beam, only selected colored phosphor areas on the screen are excited. The scanning of the screen of the cathode ray tube with an appropriate number of signal carrying electron beams causes certain selected phosphor areas to be excited and emit colors and this results in the production of a colored image on the screen of the cathode ray tube.

Various problems are encountered in the manufacture of multi-color cathode ray tubes. The discrete line or dot patterns, which are formed on conventional cathode ray tubes, are already numerous and the trend is to attempt to even more closely pack a larger number of patterns of the different color-emitting phosphors on the screen. To obtain the desired improvement in quality the phosphors must be applied in close proximity to each other and must also be present in the discrete areas in exact registration with each other and with adjacent repeats of the pattern. The different color-emitting phosphors cannot overlap each other, that is contaminate each other, as this destroys the color fidelity of the picture produced on the screen.

The technical problems which are encountered in the manufacture of cathode ray tubes are numerous and these are further complicated by commercial considerations. It is essential that any commercial process for the formation of the screens must be relatively low in cost per unit so as to make large scale production feasible. The required low-cost, mass-production methods must also result in a high quality and extreme uniformity without requiring extremely rigid process controls or highly critical and sensitive production procedures.

Various methods have been suggested in the prior art for applying the phosphors to the screens of the cathode ray tubes. One such method is disclosed in Bowerman, U.S. Pat. No. 2,854,348, wherein the surface screen is printed with a tacky material and then the surface is dusted with a suitable powdered phosphor. The printing process and the dusting process are repeated for each application of a different phosphor. The patterns which are printed on the screen of the tube must be accurately aligned with each other to prevent overlap of different phosphors and also to provide the proper registration. The printing process has proven to be inherently unsatisfactory because of the physical limitations of printing processes to produce micro-fine separations and accurate spacing of the different colored phosphor areas.

Various methods are used in accordance with the prior art which employ negative photobinders and selective radiation exposure. A negative photobinder is a material which, on exposure to radiation such as ultraviolet light, becomes relatively insoluble and nonadhesive in comparison to unexposed portions. Some conventional negative photobinders which are used in the manufacture of cathode ray tubes are chromate sensitized casein and chromate sensitized vinyl alcohol polymers.

The negative photobinder is applied to the faceplate of the cathode ray tube and then the entire area of the faceplate is exposed with the exception of those areas where it is desired to apply the phosphor. The exposed portions become nonadhesive and relatively insoluble. Then, by applying a suitable solvent, the unexposed areas can be made relatively tacky. The relatively tacky areas are then dusted with a phosphor which selectively sticks to the unexposed areas. When applying a number of different colored phosphors utilizing the above prior art technique, it is necessary to apply a new coating of the photobinder for each color phosphor which is applied.

An alternate method which has been suggested in the prior art is to apply a mixture of a negative photobinder such as those identified above and the particular type of phosphor desired to be applied to the surface of the screen either as a slurry or as a dry powdered mixture in a manner to adhere it uniformly to the screen. Using this technique, the photobinder is exposed through a shadow mask in those areas wherein it is desired to adhere the phosphors to the screen. The exposure to radiation causes the exposed areas of the photobinder to become relatively insoluble. Thereafter, the entire surface of the photobinder is developed to remove the unexposed materials. The coating procedure, the exposure and the development are repeated for the application of each type of phosphor. Such a process is disclosed by Veirs, U.S. Pat. No. 3,544,350. There are various modifications of the above processes, such as those disclosed in Lange et al., U.S. Pat. No. 3,597,258, and Saulnier, U.S. Pat. No. 3,981,729.

The prior art methods have the common problem of requiring multiple application of binder. In addition, certain of the processes require development steps between each application of phosphor as well as other similar intermediate steps such as drying and conditioning.

The production costs are increased because of the multiple steps. In addition, the chances for error in placement and cross-contamination of the phosphors is likewise significantly increased because of the multiple steps.

It would be highly advantageous if a microlithographic method could be provided for the manufacture of multi-colored products such as colored cathode ray tubes, multi-color photolithographic prints and the like which would involve fewer process steps and which provided improved accuracy of reproduction.

SUMMARY OF THE INVENTION

A method for the manufacture of multi-colored products such as fluorescent screens for colored cathode ray tubes is provided. A layer of a positive radiation depolymerizable olefin sulfone polymer is applied to the substrate on which the image or pattern is to be formed. The polymer is then exposed in predetermined areas wherein it is desired to deposit a given pigment or phosphor with a sufficient amount of radiation to depolymerize and lower the softening point of the exposed areas of the polymer relative to the unexposed area. The polymer layer is then heated to or maintained at a temperature wherein the exposed portion of the polymer is tacky but below the temperature at which the unexposed polymer becomes tacky. With certain of the lower olefin sulfone polymer after the polymer is exposed it becomes tacky at room temperature (i.e. 20° C.) whereby no separate heating step is required other than maintaining the ambient room temperature at a temperature where the exposed polymer is tacky. The layer of polymer having tacky exposed area and untacky unexposed area is supplied with the particular pigment or phosphor which is to be applied. The pigments or phosphors selectively adhere to the exposed tacky area of the polymer layer. The exposure, heating, if required, and contact by the material desired to be applied are repeated for each application of a different pigment or phosphor.

DETAILED DESCRIPTION OF THE INVENTION

Figure 1:
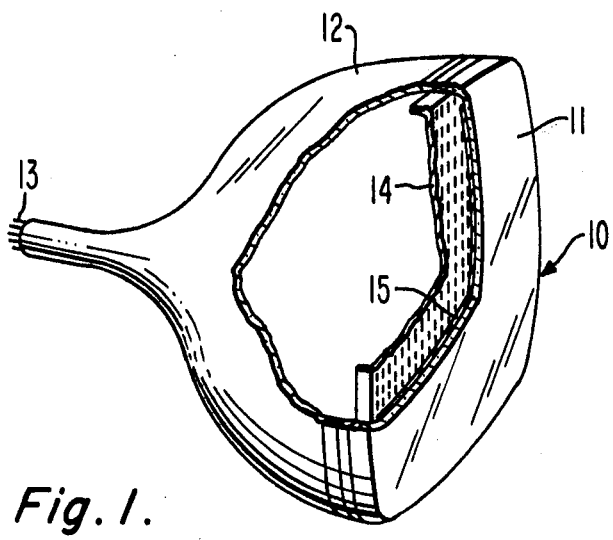
FIG. 1 is a perspective illustration with parts broken away of a cathode ray tube.

Referring to the drawing, in FIG. 1 there is shown a typical cathode ray tube 10. The cathode ray tube 10 is comprised of a faceplate 11 and a funnel portion 12, each of which is made of glass. Inside the cathode ray tube 10 there is an electron gun 13 which is aimed at a shadow mask 14 which is positioned adjacent to the faceplate 11. On the inner surface of the faceplate 11 there is a screen 15 which is comprised of various colored phosphors. When electrons are emitted from the electron gun 13 and pass through the shadow mask 14 and contact the screen 15, the phosphors on the screen 15 are excited and an image is produced on the faceplate 11.

Figure 2:
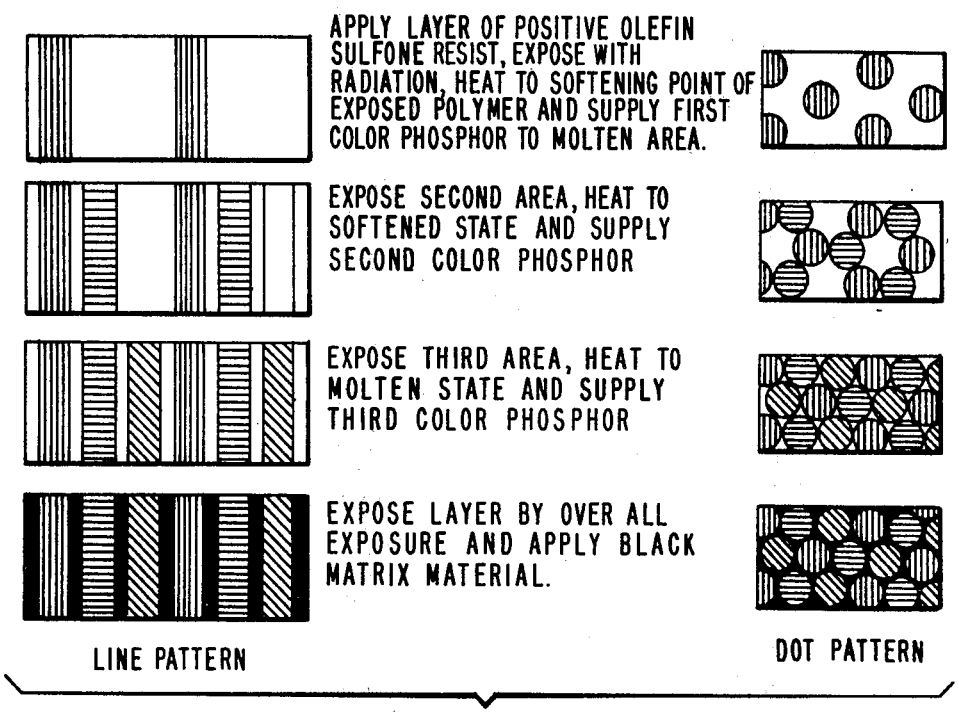
FIG. 2 is a flow diagram with accompanying illustration showing the method to produce multi-color screen with dot or line patterns.

As illustrated in FIG. 2, in accordance with this invention the screen 15 is formed on the inner surface of the faceplate in a series of steps. The faceplate 11 is coated with an olefin sulfone polymer. The coating is then exposed in discrete areas with sufficient radiation to reduce the molecular weight of the polymer and thereby lower its molecular weight. The exposed polymer is heated above its softening point but below the softening point of the unexposed polymer. A color material is applied. The colored material selectively adheres to the softened tacky exposed area. The process is repeated until all the desired color materials are applied. The areas which are exposed sequentially can be in a series of lines or groupings of dots or any other arrangement which will provide the desired positioning and registration of color materials to each other.

The polymers which are employed as the adhesive are olefin sulfone polymers. The olefin sulfone polymers are comprised of repeating units of the formula

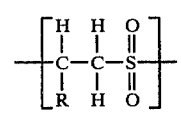

Formula I wherein R is an organic radical. The olefin sulfone polymers are well known in the art as well as their method of preparation. Polyolefin sulfones have heretofore been suggested for various applications. One important application has been an electron beam for use in the manufacture of integrated circuits and the like. The type of polymers suitable for use in this invention as well as the method of preparation are disclosed in Kaplan et al., U.S. Pat. No. 3,893,127.

The preferred olefin sulfones for use in this invention are polymers of Formula I wherein the radical R is an alkyl, alicyclic, aryl, aralkyl, or heterocyclic organic radical. The number of carbons in the organic radical R is not particularly critical provided it is not so excessively large as to adversely interfere with the radiation sensitivity of the polymer and preferably further that the decomposition product has a softening temperature at or near room temperature (20° C.). Olefin sulfone compounds wherein the group R is straight-chained or branch-chained alkyls having 3–12 carbon atoms or an alicyclic, aryl, aralkyl radical having up to 20 carbon atoms are particularly suitable. The preferred class of polyolefin sulfone polymers, from both the ease of preparation and the reactivity on exposure to radiation, are those in which R is an alkyl group having 3–12 carbon atoms, since the shorter side chain enhances the relative instability of the polymer on exposure to radiation.

The olefin sulfone polymers which are employed in this invention derive their usefulness because of the relative instability upon exposure to radiation of the sulfur-carbon bond in the polymer backbone. When exposed to radiation such as ultraviolet radiation, x-ray, electron beam radiation or the like, the polymers are believed to break down as follows:

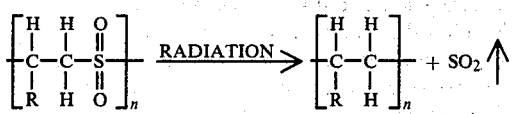

The olefin polymer which is left after exposure has a lower softening point than the starting olefin-sulfone polymer. After the polymer has been exposed to radiation, if the exposed polymer is heated slightly, and even at room temperature with certain lower molecular weight olefin polymers, the exposed polymer will become soft and adhesive. At this point color particulate material, such as color phosphors, will selectively adhere to the exposed areas as opposed to the nonexposed areas.

In accordance with this invention the polyolefin sulfone polymer can be applied to the substrate by various well-known methods. One preferred method is to dissolve the olefin sulfone polymer in a solvent and spray, spin coat or otherwise apply the solvent solution to the surface of the substrate. The resulting film is then exposed to radiation in preselected area, heated to a softening point of the exposed polymer and contacted with a supply of the color material to be applied which will adhere to the exposed tacky area but not the unexposed area.

An alternate method which is advantageously employed is to initially coat or encapsulate particles of the color material in the polyolefin sulfone. The coated particles are then applied uniformly to the subtrate. The substrate is then exposed and heated whereupon the coated, exposed particles adhere to the substrate and the unexposed particles are removed by vacuum from the surface.

Referring specifically to the manufacture of cathode ray tubes, the screen of the tube after the polymer is applied is selectively exposed to radiation in those areas wherein it is desired to deposit a phosphor. The radiation which is employed to expose the polymer can be ultraviolet radiation, an electron beam, x-ray radiation, gamma radiation and the like.

The exposure can be conducted in the conventional manner heretofore utilized in the prior art. For example, the exposure can be made through the aperture of a grid which simulates the shadow mask which will be used in the final assembled cathode ray tube. The exposure can be made using a lighthouse exposure apparatus of known construction. In order to obtain the maximum benefits of this invention, the exposure is made with deep ultraviolet light through a mask having even more apertures than are conventionally employed. When the final screen is assembled with a shadow mask having corresponding increases in apertures, there is an increase in both the relative number of phosphor sites which can be activated and an improved accuracy in the location and purity of the phosphors.

The olefin sulfone polymer is given a separate exposure in predetermined areas for each of the phosphors which is applied.

The screen with the film of polymer applied to the surface is dusted with phosphors. A separate type of phosphor is applied for each color. The specific type of phosphor and a particular size of the particles and order of application do not in and of themselves form a part of this invention apart from their use in this process.

The apparatus heretofore used for applying powders to the screens treated with negative photoresists can also be employed for use in the present invention. The powder is generally applied in a low pressure air stream directed at the screen.

The amount of particular powdered phosphor applied is dependent upon the particular phosphors utilized and the powder holding capacity of the tackified polymeric binder. If the amount of phosphor desired to be applied to a unit area is less than the amount required to fully block the adhesive exposed areas of the polymer, inert materials can be added to the phosphor. After each dusting of the phosphor the screen is preferrably vacuumed to remove any unadhered phosphor particles.

The screen is then exposed again in the same manner as above in other areas wherein it is desired to apply the second phosphor and the dusting procedure noted above is repeated. The same procedure is also followed for the application of the third phosphor and any subsequent treatments.

An advantage of the present invention is that the areas of the different phosphors are accurately located on the screen. A further significant advantage is that after each of the colored phosphors is applied, it is then possible using the olefin sulfone polymer to then flood expose the entire screen and then dust the screen with a black matrixing material which will then adhere to those areas wherein the phosphors are not adhered. This provides the advantage of providing a black matrix around the colored phosphor area which results in improved performance of the television camera.

After the application of the phosphors is completed, and any subsequent treatments such as applying the black matrixing color are also completed, the screen is then treated in the conventional manner. The entire area of the screen is then coated with an organic binder for the purpose of temporarily holding all of the phosphors in place on the screen. Then, in the conventional manner an aluminizing coating is applied over the entire structure. Thereafter the screen is baked at a sufficiently high temperature to cause the polymers and organic binder coat to thermally degrade and be removed from the screen.

The advantage obtained using the process of this invention is that with the use of olefin-sulfone polymer film, only one application of the polymer is required to be applied to the screen to adhere all of the different colored phosphors to the screen as well as any black matrixing or the like. A further advantage is that a wider selection of phosphors can be employed in this process in that the water soluble or solvent soluble phosphors having otherwise acceptable properties can be used in this process unlike certain of the prior art processes. In addition, there is no need for development steps between each application of phosphors.

The present invention has been specifically described with reference to the manufacture of color cathode ray tubes. However, as noted above it is also useful in related fields such as microlithographic printing where pigments or toners rather than phosphors are employed. A further use is in textiles for printing of multi-color flock patterns and the like.

What is claimed is:

1. The method for adhering a plurality of different colored material to a substrate with the individual colored material in a predetermined pattern, said method comprising the steps of applying to a surface of the substrate a layer of an olefin sulfone polymer having repeating units of the formula

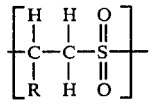

wherein R is an organic radical, said polymer being nonadhesive at a first temperature, exposing the polymer in preselected area of the substrate to radiation in an amount sufficient to reduce the softening temperature of the exposed polymer to a second temperature at which the exposed polymer is adhesive, maintaining said substrate at said second temperature or higher but below said first temperature while providing a supply of one of said colored materials to the resulting softened area of exposed polymer whereby the colored material selectively adheres to the exposed area and thereafter repeating the steps of exposing, heating and provision of colored material for each of the additional colored materials in other preselected areas of the substrate to provide said predetermined pattern.

2. The method according to claim 1 wherein the color material is in particle form and said particles are initially coated with polymer and then polymer is applied to substrate, exposed and heated whereby the coated colored selective material adheres in the exposed area and the remainder of the coated particles are removed.

3. The method according to claim 1 wherein the color material is applied to the surface substrate after the polymer has been exposed to radiation and heated to the adhesive state whereby the color material selectively adheres to the exposed area.

4. The method according to claim 1 wherein the substrate is the faceplate of a cathode ray tube.

5. The method according to claim 4 wherein the color materials are color-emitting phosphors.

6. The method according to claim 5 wherein the faceplate is sequentially exposed and then supplied with color phosphor for at least three cycles.

7. The method according to claim 6 wherein after each exposure the faceplate is sequentially contacted with different color phosphors with said phosphors being blue, green, and red color-emitting phosphors.

8. The method according to claim 7 wherein after sequentially exposing and sequentially applying the color phosphors the screen is exposed overall and dusted with a black matrixing material whereby a black matrix is formed about the areas having color phosphors adhered thereto.

* * * * *